US005486264A

United States Patent [19]
Ghandour

[11] Patent Number: 5,486,264
[45] Date of Patent: Jan. 23, 1996

[54] LASER ETCHING OF SEMICONDUCTORS

[75] Inventor: Osman A. Ghandour, New York, N.Y.

[73] Assignee: The Trustees of Columbia University, New York, N.Y.

[21] Appl. No.: 231,886

[22] Filed: Apr. 22, 1994

Related U.S. Application Data

[63] Continuation-in-part of Ser. No. 857,449, Mar. 25, 1992, abandoned.

[51] Int. Cl.⁶ .................................................. H01L 21/306
[52] U.S. Cl. ...................................... 156/635.1; 156/643.1
[58] Field of Search ............................... 156/635.1, 643.1

[56] References Cited

U.S. PATENT DOCUMENTS

| | | | |
|---|---|---|---|
| 4,904,340 | 2/1990 | Miracky et al. | 156/666 |
| 5,057,184 | 10/1991 | Gupta et al. | 156/659.1 |

OTHER PUBLICATIONS

Takai, M., et al., "Laser Induced Etching of III–V Compound Semiconductors", May 6, 1986, pp. 805–810.
Grebel, H., et al., "Photoelectrochemical etching of n–InP in a thin–film cell", Dec. 18, 1989, pp. 2655–2657; Appl. Phys. Lett 55 (25).
Kohl, P. A., et al., "p–InP photoetching", Oct. 1990, pp. 3315–3316; Electrochem. Soc. vol. 137, No. 10.
Svorcik, V., et al., "Photoelectrochemical etching of n–GaAs and n–InP", 1988; pp. K35–39; Physica Status Solidi (a) 106.
Svorcik, V., et al., "laser–stimulated etching of n–type semiconductors", Mar. 11, 1988, pp. 548–551; Chemical Physics Lett. vol. 144, #5,6.
Bjorkholm, J. E., et al., "Localized wet–chemical etching of inP induced by laser heating", pp. 574–576; Appl. Phys. Lett. 43 (6) Sep. 15, 1983.
Li, ding, et al., "Properties of laser–induced thermochemical etching of InP," 1988, pp. 29–32; Journal of Electronic Materials vol. 17, No. 1.
Willner, A. E., et al., "Photobias effect in laser–controlled etching of InP," pp. 1198–1200; Appl. Phys. Lett. 53 (13), Sep. 26, 1988.
D'Asaro, L. A., et al., "Improved Performance of GaAs Microwave Field–Effect Transistors with Low Inductance Via–Connections Through the Substrate," Oct. 1978; pp. 1218–1221; IEEE Trans. on Electron Devices; vol. ED–25, No. 10.
Andrade, T., "Manufacturing Technology for GaAs Monolithic Microwave Integrated Circuits;" Solid State Technology, pp. 199–205, Feb. 1985.
Ferry, David K., "Gallium Arsenide Technology," 214–217.
Arnaud, J. A., "Technique for Fast Measurement of Gaussian Laser Beam Parameters," Dec. 1971, pp. 2775–2776; Applied Optics, vol. 10, No. 12.

*Primary Examiner*—R. Bruce Breneman
*Assistant Examiner*—Linda J. Fleck
*Attorney, Agent, or Firm*—Brumbaugh, Graves, Donohue & Raymond

[57] ABSTRACT

A laser-based technique for rapid etching of a semi-insulating substrate is described wherein a vertically suspended semiconductive sample is placed in an etchant solution. An intermittent laser beam is applied thereto whereby gas bubbles formed during the application of the laser beam to the laser reaction zone are displaced during the dark period of the intermittent laser beam.

7 Claims, 4 Drawing Sheets

LASER ETCHING OF SEMICONDUCTORS

This invention was made with United States Government support under DARPA Contract No. F49620-89-C-0088. The U.S. Government has certain rights in this invention. This application is a continuation-in-part of application Ser. No. 07/857,449, filed on Mar. 25, 1992, now abandoned.

FIELD OF USE

The present invention relates to a technique for etching a semiconductor substrate with a laser.

BACKGROUND OF THE INVENTION

Laser assisted etching of semiconductor substrates and some of the inherent problems therewith have been previously described by Bjorkholm, J. E. and Ballman, A. A., in an article entitled "Localized Wet-Chemical Etching of InP Induced by Laser Heating" Applied Physics Letters Vol. 43, No. 6 (1983), pp. 574–76 ("the Bjorkholm et al. article"). The Bjorkholm et al. article describes the etching of grooves in indium phosphide samples mounted vertically in a quartz curette containing an etching solution of aqueous $H_3PO_4$.

The Bjorkholm et al. article describes the effects of laser power and scan rates on the laser etching of continuous cross sections of grooves in an InP sample. The article identifies a potential problem attributable to gas bubbles generated when the grooves are etched. The gas bubbles are potentially troublesome because they tend to cling to the etched grooves and produce a barrier between the substrate sample and the etchant solution which causes laser light which is subsequently applied thereto to be scattered and defocused. The area in which the laser beam is applied on the sample is sometimes referred to as "the laser reaction zone". The Bjorkholm article describes the conditions under which bubble formation was found to be a problem. For sufficiently high scan rates, which allow the laser beam to "run away" from the bubble, etching was not impeded. However, in the case of stationary etching as required for via hole formation, or scan rates for making deeper grooves, the bubble formation can stop the etching process.

The gaseous bubble barrier in the laser reaction zone causes scattering and defocusing of the incident laser beam, and significantly reduces or can even stop the etching process in the area beneath the gas bubble. This problem is especially troublesome in cases where a slow scan rate or no scan rate, e.g., in via-hole etching, of the incident light source is used, and also in cases where higher power lasers are used which promote thermal heating and the generation of gas bubbles. Slow scan rates are used in cases where, unlike the shallow grooves described in the Bjorkholm et al. article, a groove having a high aspect ratio is desired. In such cases the laser cannot simply run away from the forming gas bubbles and the process is interrupted by the forming gas bubbles.

In addition to slowing the etching process, the scattered light produced by the gas bubbles makes it difficult to produce small closely spaced via holes because the scattered light causes etching of a greater surface area of the substrate than is desired. In certain applications, e.g., fabrication of MMICs, small closely spaced via holes are desirable in order to achieve low-inductance grounding. Low-inductance grounding may be achieved by using the via hole technique which allows the placement of grounds through the substrate. The necessary holes are back etched through the substrate until the front metallization pattern is reached. These holes are subsequently metallized simultaneously with the ground plane to provide a continuity between ground plane and the desired frontside pads of the metallization pattern. These frontside pads are usually small and very closely spaced apart. This makes it essential for the via holes connecting the front pads to the back ground plane to be small throughout their length.

SUMMARY OF THE INVENTION

It is an object of this invention to provide a technique for laser etching of a substrate sample in an etching solution, which significantly alleviates the problem of gas bubbles generated by the laser etching. The technique, in accordance with the invention, provided herein uses an intermittent focused laser beam which impinges, preferably at normal incidence with respect to the substrate surface on a substrate sample immersed in an etching solution and oriented such that gas bubbles formed during laser etching can escape from the region of the substrate being etched, i.e., the gas bubbles float away from the substrate region being etched, during the time period in which the laser beam is not being applied. The effect of scattered light due to gas bubbles formed during the etching process is minimized by this technique. The diameters of the etched holes produced by this technique are more uniform throughout their length than known techniques and the amount of time needed to etch a given area is reduced. The etching technique is also sufficiently selective to allow blind holes which terminate on a side of a substrate covered by a layer, i.e., the metal layer acts as an etch stop.

BRIEF DESCRIPTION OF THE DRAWINGS

Further objects and advantages of the invention will be apparent from a reading of the following description in conjunction with the accompanying drawings in which.

DETAILED DESCRIPTION

Figure 1:
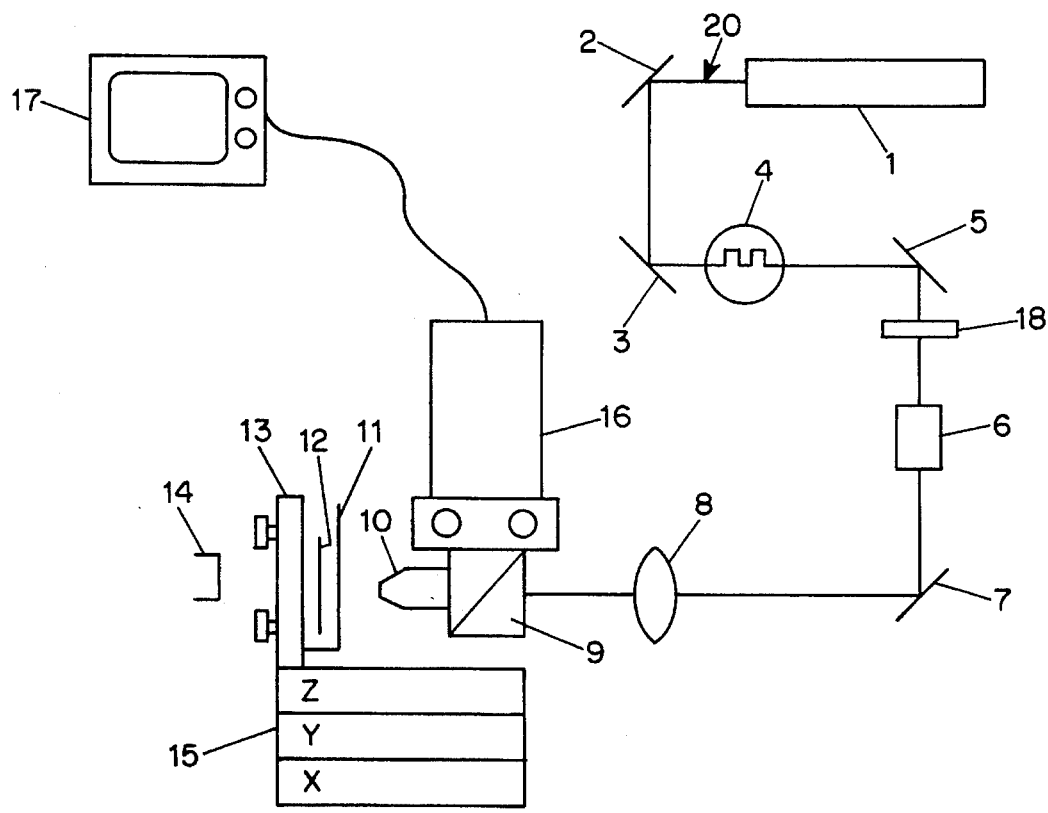
FIG. 1 is a schematic representation of an apparatus illustrative of a preferred embodiment of the present invention.

The formation of gas bubbles in the laser reaction zone produces a barrier of gaseous bubbles between a substrate sample and the etchant solution. However, by mounting the sample 12 vertically, as shown in FIG. 1, in an open ended quartz cell 11 and by using a mechanical chopper 4 to interrupt the laser beam 20, the gas bubbles which formed on the surface of the sample 12 are periodically allowed to escape from the region being etched to the surface of the etching solution. The beam is interrupted for a sufficient time to permit the bubbles to escape the etching region. When the beam 20 is reapplied to the surface of the sample 12 after the interruption, there no longer exists a gaseous barrier between the sample 12 and the etchant solution, and the intensity of the laser light impinging on the region of the sample 12 being etched is again maximized.

The apparatus shown in FIG. 1 illustrates a preferred embodiment of the present invention. In FIG. 1, a cw Argon-Ion laser 1 with a maximum available power of 6.5 W at a wavelength of 514 nm is Used as the light source. In this embodiment, the laser beam 20 is first steered by two aluminum mirrors 2 and 3, and is then intermittently interrupted by a mechanical chopper 4. The mechanical chopper 4 comprises a rotating opaque disk 30 having multiple slots 31 (only one slot shown in the figure), as shown in FIG. 2, which converts the cw laser beam into periodic pulses having a frequency of 4–5 Hz.

Figure 2:
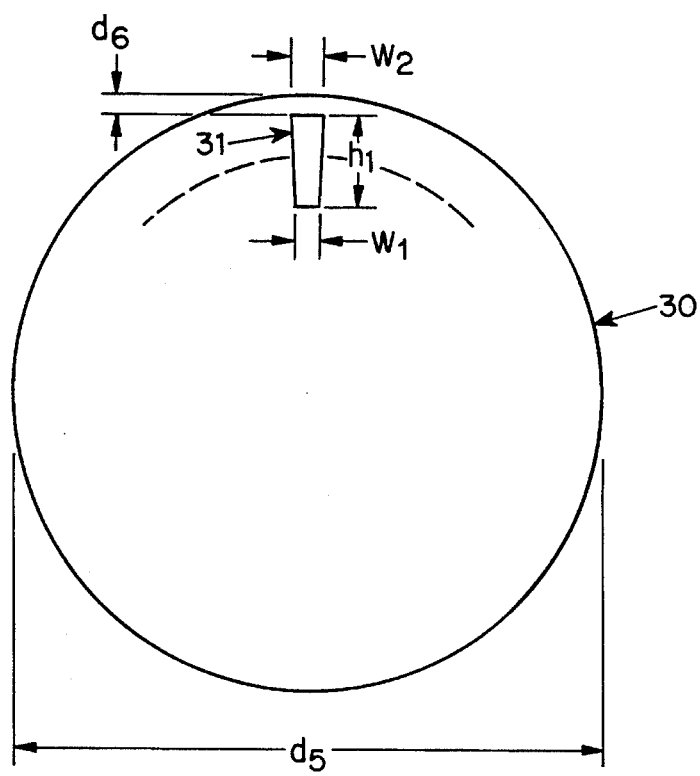
FIG. 2 is a front view of a slotted disk used in the mechanical beam chopper of the apparatus of FIG. 1.

The slotted disk 30 shown in FIG. 2 is one of a number of possible designs known to those skilled in the art which could be used to periodically interrupt the laser beam 20. The round slotted disk 30 is connected to a variable speed rotating mechanism (not shown) which allows the rotational speed of disk to be adjusted. The slotted disk 30 shown in FIG. 2 has a diameter $d_5$ of 10.1 cm and includes 30 equally spaced slots 31 which are approximately 5 mm apart. Each of the slots 30 has an opening having a bottom width $w_1$ of 4 mm, a top width $w_2$ of 5 mm and a height $h_1$ of 1.50 cm, the top and bottom widths $w_1$ and $w_2$ being large compared to the diameter of the laser beam 20. The top portion of the slot is a distance $d_6$ of 2.5 mm from the outer edge of the disk.

With slot width increasing radially from 4 to 5 mm, with a distance between slots of 5 mm, and with constant rotation rate for the slotted disk, the laser beam has a duty cycle in a range from 4/9 to 5/9, i.e., from 44 to 55 percent depending on the radial position of the laser beam. While a detrimental influence of gas bubbles on hole geometry may be expected to increase with increasing duty cycle, in a preferred method in accordance with the invention duty cycle is in a range from 30 to 60 percent.

After passing through the mechanical chopper 4, the laser beam is steered by another aluminum mirror 5, as shown in FIG. 1, and directed through an electronically controlled shutter 18. The shutter 18 consists of a round opening having a diameter of 3 mm which can be closed by activating a switch (not shown). The shutter 18 provides a means for turning the beam on and off. Once the beam is permitted to pass through the shutter 18, the beam 20 is passed through a quartz plate attenuator 6 which is used to adjust the laser beam intensity to a desired level. The beam 20 is subsequently steered by another aluminum mirror 7 through a defocusing lens 8 (sometimes referred to as a beam expander) which expands the beam before it passes into a beam splitter 9.

The beam splitter 9 passes approximately 80% of the beam intensity through to the objective lens 10. The beam splitter 9 deflects sufficient light to allow viewing of the area of the sample 12 which is being etched through a video camera 16, shown in FIG. 1. The video camera 16 is connected to a TV monitor 17 and may be used to both focus the beam 20 on the sample 12 and to monitor the etching process. The microscope objective lens 10, is also used to tightly focus the beam 20 on the sample 12, i.e., to focus the beam 20 to a spot size of 2–3 µm on the sample 12 in the area to be etched. By varying the distance from the defocusing lens 8, which expands the laser beam, to the objective lens 10, the diameter of the laser beam spot size on the sample 12 is varied.

It was found that, in the interest of uniformity of diameter of an etched hole, there is a preferred relative position of the surface of the substrate and of the laser beam waist. Preferably, the beam waist is in front of the surface by a distance equal to the beam confocal parameter. For a typical beam, with Gaussian intensity distribution, the confocal parameter is the distance from the beam waist to the point where the beam has spread to a diameter 2½ times the beam waist diameter. In an exemplary case, with a typical beam waist of 2–3 µm, preferred positioning places the beam waist 13–15 µm in front of the substrate surface.

Figure 3:
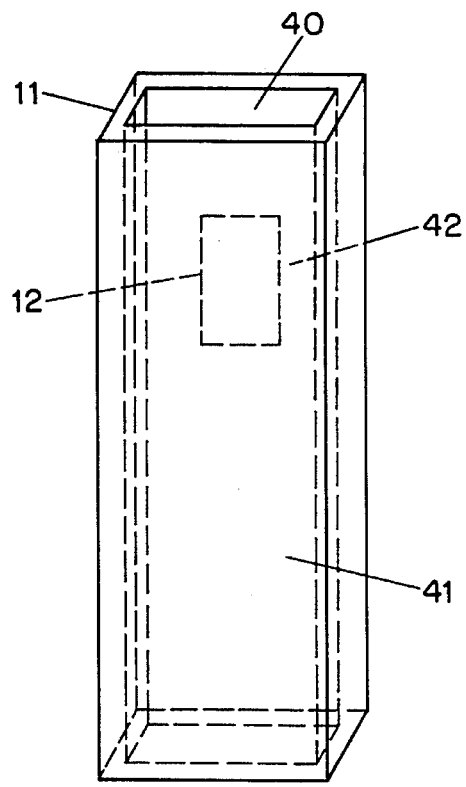
FIG. 3 is an isometric view of the quartz cell of the apparatus of FIG. 1.

After passing through the objective lens 10, the laser beam 20 impinges the front window 41 of the quartz cell 11, shown in FIG. 3, and passes through the etchant solution in the cell onto the sample 12 which is positioned on the inside back wall 42 of the quartz cell 11. The sample 12 may be held on the inside of the back wall of the quartz cell 42 opposite to the front window 41 by using black wax on the back of the sample 12 and pressing the sample 12 into position on the back wall 42. The quartz cell 11 is mounted on a vertically disposed adjustable stage 13, shown in FIGS. 1 and 4, with either an adhesive material or other appropriate mounting means.

The quartz cell 11, shown in FIG. 3, is a quartz container having an open top area 40. The quartz cell 11 is filled with an etchant solution (discussed below) before the laser beam 20 is applied to the sample 12. The top area 40 of the quartz cell 11 is open to allow gas bubbles formed during the etching process to freely escape up to the surface of the etchant solution. The size of the quartz cell 11 may vary depending on the size of the sample 12 to be placed therein.

Figure 4:
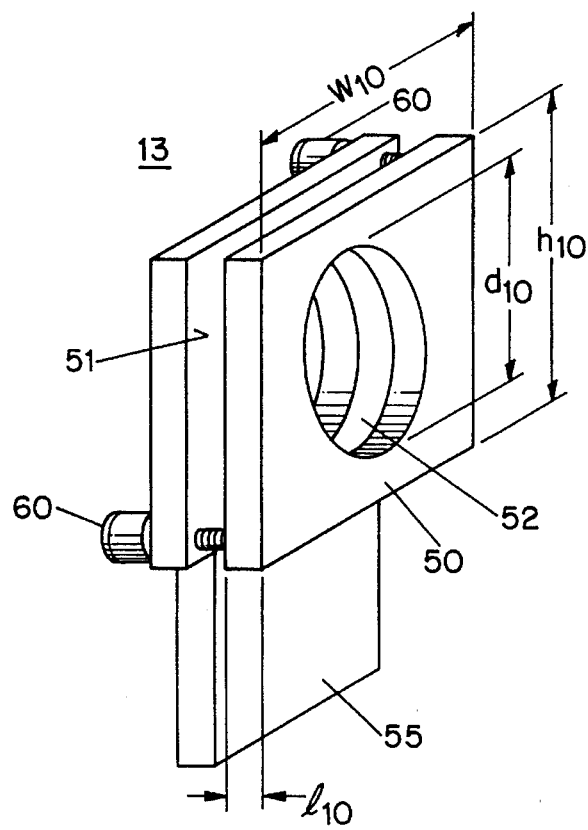
FIG. 4 is an isometric view of a cell positioning device vertical stage of FIG. 1.

The vertical stage 13, shown in FIG. 4, can be made of any rigid material, e.g., aluminum. In the example shown in FIG. 4, the front plate 50 and the rear plate 51 of the stage 13 are square aluminum pieces having circular openings 52. The bottom block piece 55 is attached to the rear plate 51 and to a computer controlled stage 15, shown in FIG. 1. Adjustable screws 60 are also provided to permit adjustment of the tilt of the quartz cell 11 (and therefore the sample being etched) once it has been mounted to the stage 13.

The circular openings 52 of the vertical stage are located behind the sample and allow a photodetector 14 situated behind the stage 13, as shown in FIG. 1, to monitor the amount of light passing through the sample 12 when etching through via holes, and also permit the detection of sudden changes in reflected and scattered light behind the metallization layer of the substrate sample 12 when etching blind via holes.

The vertical stage 13 is mounted by block 55 on computer controlled X,Y,Z stages 15. With the aid of a computer (not shown) the X, Y and Z stages can be moved to locate and focus the beam 20 on different areas of the sample 12 to etch an array of via holes in the sample 12. The use of such stages are known to those skilled in the art and will not be explained in further detail herein.

The sample 12 used in a preferred embodiment of this invention were slightly polished single-crystal wafers of Fe doped Si-InP thinned to 100 µm and metallized on one side with 250Å Ti, 500Å Pt, and 5000Å Au, respectively. The laser beam impinged on the side of the sample which is not metallized. The preferred etching solutions for the sample, are $HCL:HNO_3:H_2O::1:2:10$ or $H_2SO_4:H_2O_2:H_2O::1:1:100$. However, the latter proved to be more effective in the process since, in contrast to the former, it did not significantly attack the metallization layers of the sample and provided faster etching of via holes in the sample.

Figure 5:
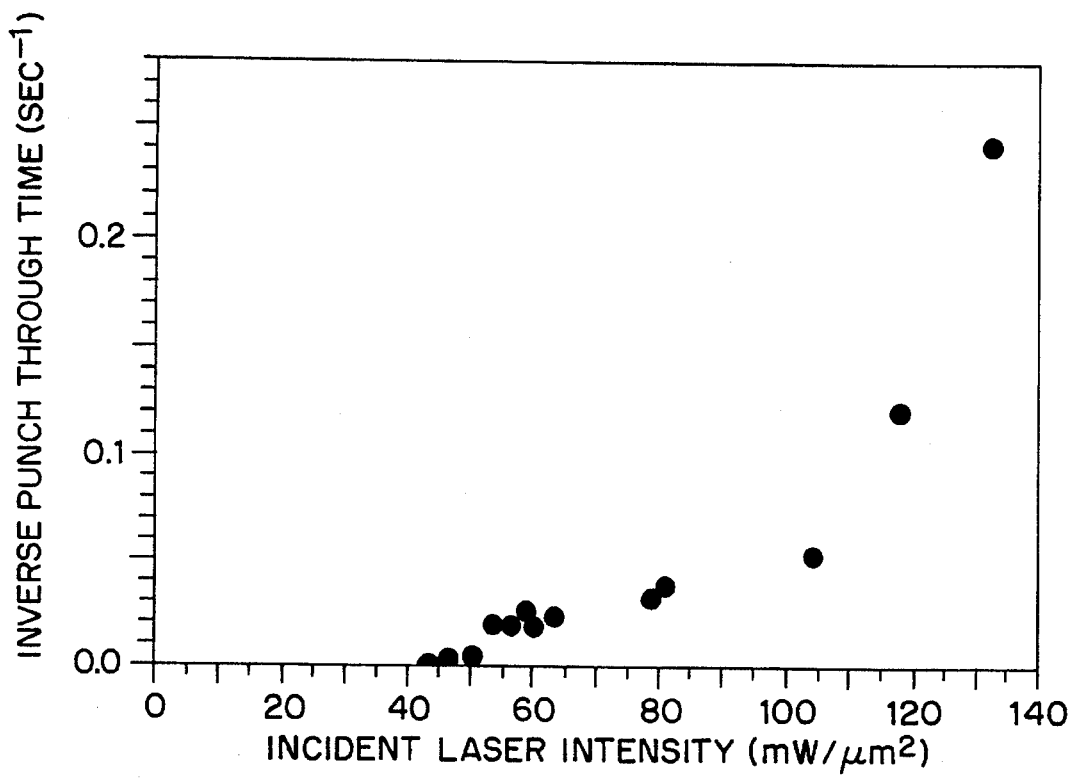
FIGS. 5 and 6 are graphs plotting the inverse punch through time versus laser intensity for etching of a via hole in etching solution.
Figure 6:
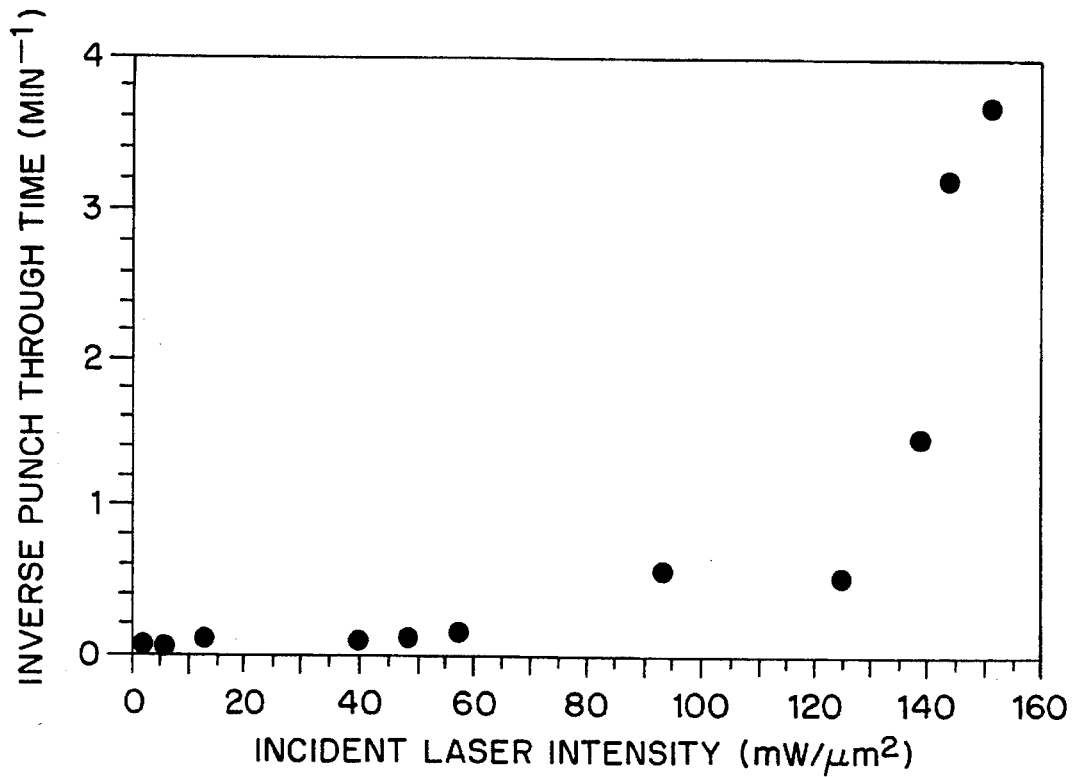

FIGS. 5 and 6 show plots of the inverse of the etch time vs. laser intensity for the two preferred etchant solutions.

The data in FIG. 5 was obtained by timing how long it took the beam to etch through a 100 μm thick Si-InP substrate immersed in a solution of $H_2SO_4:H_2O_2:H_2O::1:1:100$ with an argon-ion laser having a wavelength of 514 mm. FIG. 6 represents the inverse punch through time ($min^{-1}$) to laser intensity ($mW/\mu m^2$) relationship for a Si-InP (100 μm thick) immersed in an etchant solution of $HCL:HNO_3:H_2O::1:2:10$ and illuminated with the same wavelength argon laser light. In the lower intensity regime the etch rate initially rises linearly with intensity. For higher intensities, there is a distinct threshold above which the etch rate increases dramatically. This value occurs approximately at the same intensity level for both solutions. However, the $H_2SO_4:H_2O_2:H_2O$ solution proved faster and did not significantly attack the metallization layers of the sample 12.

Figure 7:
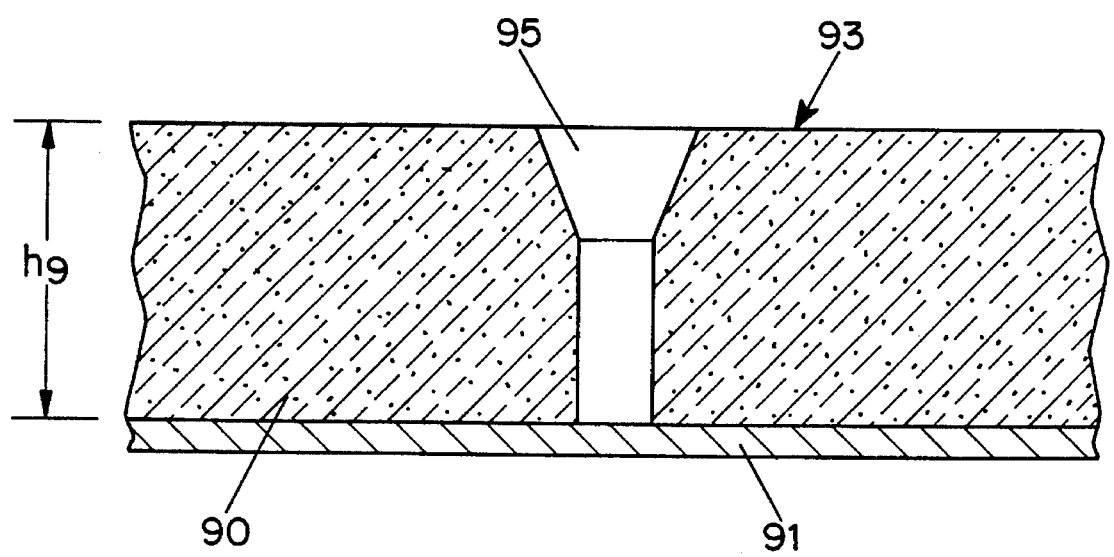
FIG. 7 is a cross-section of a substrate including a via hole according to the present invention.

With a $H_2SO_4:H_2O_2:H_2O::1:1:100$ etchant solution and argon-ion laser of ~$10^7$ $W/cm^2$ power intensity, a via hole structure in a 100 μm thick Fe doped semi-insulating InP sample can be obtained in ~4 seconds. FIG. 7 shows a cross section of the via hole structure produced by the present invention. The via holes produced according to the present invention were not tapered throughout their lengths. As seen in FIG. 7, a via hole 95 produced according to the present invention in a substrate 90 having a thickness $h_9$ of 100 μm was slightly tapered (from about 50 μm down to 25 μm) on the front face of the sample where the laser beam was initially applied but has a consistent diameter throughout a major portion of its length. Due to high chemical selectivity in the thermal etching process, the etching process stopped at the metal layer 91 without significantly attacking the metal.

Although specific embodiments of the present invention have been illustrated and explained, various alterations and modifications may be made to the illustrated embodiments by those skilled in the art without departing from the scope of the invention as defined by the appended claims. For example, the laser beam could be set directly in the direction of the sample without the need for mirrors, and the intermittent laser beam could also be produced with a pulsed laser or by electrically coupling the shutter switch to a variable switching circuit which opens and closes the shutter in order to pulse the laser without the need of a mechanical chopper. Furthermore, the sample need not be oriented vertically, but may assume any orientation which would permit bubbles formed during etching thereof to easily escape from the region being etched in the duration when the laser beam is blocked.

For realization of a significant benefit in accordance with a further aspect of the invention, the relative positions of the substrate and the laser beam should be such that a bubble escaping from the laser reaction zone on the substrate does not reach the etch-cell beam-entry window at a point in the beam path. For example, for a typical laser beam with perpendicular incidence on a substrate, for a typical bubble diameter of approximately 0.5 millimeter, and for a typical distance between the substrate and the etch cell front window of 2 millimeters, the substrate should be tilted at least 15 degrees and preferably at least 20 degrees from the horizontal. Such a tilt will also suffice for bubbles to detach during shuttered periods.

While via holes are customarily etched perpendicular to a surface substrate, etching of oblique holes is not precluded. In such cases, with the substrate horizontal and the laser beam coming in at an angle, there is no danger of escaping bubbles adhering to the beam-entry window in the path of the beam. Still, the substrate is preferably tilted from the horizontal so that, during dark periods, bubbles do detach from the substrate, without adhering to the beam-entry window at a point in the beam path.

I claim:

1. A process for etching a region of a semiconductor substrate immersed in an etchant solution and illuminated with light of an appropriate wavelength, comprising the steps of:

placing the substrate in the etchant solution in a selected orientation; and applying an intermittent focused light beam having a selected direction on said region until a desired level of etching has occurred;

wherein the orientation of the substrate and the direction of the light beam are selected such that bubbles formed during etching escape from the substrate during intermission of the light beam, and such that the bubbles escape without blocking the light beam, and wherein the light beam has a beam waist with a diameter, and wherein the beam waist is in front of the substrate by a distance which equals 2½ times the diameter of the beam waist, whereby a via hole is etched in the substrate, having a constant diameter over a major portion of hole depth.

2. The process of claim 1, wherein the orientation of the substrate is such that said region is tilted from the horizontal by an angle of at least 15 degrees.

3. The process of claim 1, wherein the light beam has a duty cycle in a range from 30 to 60 percent.

4. The process of claim 1, wherein the light beam is a mechanically chopped laser beam.

5. The process of claim 1, wherein the laser beam is an argon-ion laser beam.

6. The process of claim 1, wherein the etchant solution comprises $H_2SO_4:H_2O_2:H_2O$.

7. The process of claim 1, wherein the substrate is an Fe-doped semi-insulating Si-InP substrate.

\* \* \* \* \*

UNITED STATES PATENT AND TRADEMARK OFFICE
CERTIFICATE OF CORRECTION

PATENT NO. : 5,486,264
DATED : January 23, 1996
INVENTOR(S) : Ghandour

It is certified that error appears in the above-indentified patent and that said Letters Patent is hereby corrected as shown below:

<u>Col. 4, line 6</u>, replace "2 1/2" with --$2^{1/2}$--.
<u>Col. 6, line 35</u>, replace "2 1/2" with --$2^{1/2}$--.

Signed and Sealed this

Eighteenth Day of June, 1996

Attest:

BRUCE LEHMAN

Attesting Officer     Commissioner of Patents and Trademarks